(12) United States Patent
Son

(10) Patent No.: US 9,898,254 B2
(45) Date of Patent: Feb. 20, 2018

(54) DATA EXTRACTION METHOD AND APPARATUS

(71) Applicant: SAMSUNG ELECTRONICS CO., LTD., Suwon-si (KR)

(72) Inventor: BongKi Son, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/299,010

(22) Filed: Oct. 20, 2016

(65) Prior Publication Data

US 2017/0244923 A1   Aug. 24, 2017

(30) Foreign Application Priority Data

Feb. 22, 2016 (KR) .................. 10-2016-0020441

(51) Int. Cl.
| | | |
|---|---|---|
| G06F 7/74 | (2006.01) | |
| H03K 19/20 | (2006.01) | |
| H03K 19/21 | (2006.01) | |
| H04N 5/3745 | (2011.01) | |
| H04N 5/378 | (2011.01) | |

(52) U.S. Cl.
CPC ............. *G06F 7/74* (2013.01); *H03K 19/20* (2013.01); *H03K 19/21* (2013.01); *H04N 5/378* (2013.01); *H04N 5/37455* (2013.01)

(58) Field of Classification Search
USPC .......................................... 341/93
See application file for complete search history.

(56) References Cited

U.S. PATENT DOCUMENTS

| | | | |
|---|---|---|---|
| 3,430,208 A | 2/1969 | Axelson | |
| 6,513,053 B1* | 1/2003 | Hill | ............ G06F 7/74 |
| 7,719,589 B2* | 5/2010 | Turchetta et al. | ..... H04N 3/155 |
| 9,323,498 B2* | 4/2016 | Kim | .............. G06F 7/49942 |
| 2003/0105786 A1* | 6/2003 | Athas | .......... G06F 7/74 |
| 2005/0289203 A1 | 12/2005 | Breternitz, Jr. et al. | |
| 2013/0038583 A1 | 2/2013 | Shimada et al. | |

FOREIGN PATENT DOCUMENTS

| | | |
|---|---|---|
| JP | 2005-63540 A | 3/2005 |
| JP | 2009-273079 A | 11/2009 |
| JP | 2014-175834 A | 9/2014 |
| KR | 2003-0082255 A | 10/2003 |

OTHER PUBLICATIONS

EDABoard.com Forum Digital Design and Embedded Programming, "Solutions for leading one detector" retrieval URL: http://www.edaboard.com/thread201958.html thread Date Feb. 12, 2011 retrieved Mar. 20, 2017.*

(Continued)

*Primary Examiner* — Howard Williams
(74) *Attorney, Agent, or Firm* — Sughrue Mion, PLLC

(57) ABSTRACT

An apparatus is configured to extract a rightmost bit position of a target value based on input data and a complement of the input data, sequentially extract a bit position of the target value, and output the extracted bit position.

2 Claims, 12 Drawing Sheets

(56) References Cited

OTHER PUBLICATIONS

EDABoard.com Forum Digital Design and Embedded Programming, "Solutions for leading one detector" retrieval URL: http://www.edaboard.com/thread201958.html thread Date Feb. 12, 2011 retrieved Mar. 20, 2017. Updated URL retrieval http://www.edaboard.com/showthread.php?t=201958, Publisher WTWH Media wtwhmedia.com.*
Henry S. Warren, Jr.; "Hacker's Delight: Second Edition"; Addison-Wesley; Pearson Education, Inc.; 2013; 12 pages total.
Communication dated Jun. 8, 2017 issued by the European Patent Office in counterpart European Patent Application No. 16195415.1.

* cited by examiner

DATA EXTRACTION METHOD AND APPARATUS

CROSS-REFERENCE TO RELATED APPLICATION

This application claims priority from Korean Patent Application No. 10-2016-0020441, filed on Feb. 22, 2016 in the Korean Intellectual Property Office, the disclosure of which is incorporated herein by reference in its entirety.

BACKGROUND

1. Field

Methods and apparatuses consistent with exemplary embodiments relate to data extraction.

2. Description of the Related Art

A sensor including a plurality of elements may include a detecting element configured to detect a signal for each of the elements, an analog circuit configured to amplify the signal detected by the detecting element, and a digital circuit configured to process the amplified signal.

In the sensor, the data might not be generated in an element disposed at a predetermined position of the sensor, but may be arbitrarily generated based on, for example, a use condition, an environment, and a situation. In this example, each of the sensor elements need to be explored, which may lead to excessive power consumption and a degradation in a signal processing efficiency of the digital circuit.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an exemplary embodiment, there is provided an apparatus for extracting data, the apparatus including a data receiving circuit configured to receive input data containing target values randomly disposed in bit positions, the bit positions including a zeroth bit position through an (N−1)th bit position, the N being an integer greater than 1; a complement generating circuit configured to generate a complement of the input data, by inverting bit values of the bit positions of the input data and adding a value of 1 to the input data which has been inverted; a bit position extracting circuit configured to extract a bit position containing a target value being disposed in or closest to the zeroth bit position in the input data, among the target values present in the bit positions of the input data, based on the complement and the input data; and a processor configured to output the extracted bit position.

The bit position extracting circuit may be configured to sequentially extract the bit positions containing the target values, from the data input thereto.

The apparatus may further include a data converter configured to convert the input data by initializing a bit value of the bit position extracted in a current cycle, and output the converted input data to be used in a next cycle.

The data converter may include an exclusive OR (XOR) gate configured to generate the converted input data by performing a bitwise XOR operation on corresponding bit values of the input data and the extracted bit position.

The bit position extracting circuit may be configured to sequentially extract a rightmost bit position containing the target value, from the data input thereto, wherein the rightmost bit position is a bit position containing the target value and disposed closest to the zeroth bit position in the data which are input to the bit position extracting circuit.

The bit position extracting circuit may include a logical product AND gate configured to generate a bit position data, in which only one bit position has a value corresponding to the target value, by performing a bitwise AND operation on corresponding bit values of the input data and the complement, wherein the bit position extracting circuit is configured to extract the bit position containing the target value being disposed in or closest to the zeroth bit position from the bit position data.

The complement generating circuit includes a NOT gate configured to generate an inverted input data in which the bit values are inverted with the respect to the bit values of the input data, by performing a bitwise NOT operation on the input data; and an adder configured to generate the complement by adding the value of 1 to the inverted input data.

The apparatus may further include an output circuit element, wherein the processor is configured to generate a clock signal and control the output circuit element to output each of the bit positions sequentially extracted based on the clock signal.

The output circuit element may be further configured to output each of the extracted bit positions as a binary log value.

The apparatus may further include a termination determining circuit element configured to generate a termination signal in response to a determination that all of the bit positions containing the target values are extracted from the input data.

The data receiving circuit may be further configured to perform a bitwise NOT operation on the input data and transfer the input data obtained via the bitwise NOT operation to the complement generating circuit and the bit position extracting circuit.

The apparatus may further include an event sensor including pixels, and wherein positions of the pixels from which an event occurs are used as the input data received by the data receiving circuit.

According to an aspect of an exemplary embodiment, there is provided a method of extracting data, the method including receiving input data containing target values randomly disposed in bit positions, the bit positions including a zeroth bit position through an (N−1)th bit position, the N being an integer greater than 1; generating a complement of the input data, by inverting bit values of the bit positions of the input data and adding a value of 1 to the input data which has been inverted; extracting a bit position containing a target value being disposed in or closest to the zeroth bit position in the input data, among the target values present in the bit positions of the input data, based on the complement and the input data; and outputting the extracted bit position.

The method may further include sequentially extracting the bit positions containing the target values.

The method may further include converting the input data by performing a bitwise XOR operation in corresponding bit values of the input data and the extracted bit positioning and using the converted input data in a next cycle.

The extracting of the bit position may include generating a bit position data, in which only one bit position has a value corresponding to the target value, by performing a bitwise AND operation on corresponding bit values of the input data and the complement; and extracting a rightmost bit position having the target value from the bit position data, wherein the rightmost bit position is a bit position closest to the zeroth bit position.

The method may further include sequentially extracting and outputting each of the bit positions, based on a clock signal.

The outputting may include outputting each of the extracted bit positions as a binary log value.

The method may further include generating a termination signal in response to a determination that all of the bit positions containing the target values are extracted from the input data.

The input data may be position of pixels in an event sensor from which an event occurs.

According to an aspect of an exemplary embodiment, there is provided an apparatus for extracting data based on a group, the apparatus including a group generator configured to generate group data by grouping input data into groups; a group extracting circuit configured to extract a group bit position of a target group value from the group data; a group selector configured to select the group based on the group bit position and select partial data corresponding to the selected group from the input data; a data extracting circuit configured to sequentially extract a bit position of a target value from the partial data; and a processor configured to output the extracted bit position.

The group extracting circuit may be further configured to extract a subsequent group bit position of the target group value in response to a determination that all bit positions corresponding to the target value are extracted by the data extracting circuit from the partial data, and the group selector is further configured to select subsequent partial data based on the subsequent group bit position.

According to an aspect of an exemplary embodiment, there is provided a non-transitory computer-readable recording medium having recorded thereon a software program which, when executed by a processor, causes the processor to execute the method including: obtaining input data containing target values and non-target values randomly disposed in bit positions, the bit positions including a zeroth bit position through an (N−1)th bit position, the N being an integer greater than 1; generating a complement of the input data, by inverting bit values of the bit positions of the input data and adding a value of 1 to the input data which has been inverted; generating a bit position data in which only a first bit position has a target value maintained, among the target values present in the bit positions of the input data, the first bit position being the zeroth bit position or the bit position closest to the zeroth bit position, based on the input data and the complement; extracting the first bit position containing the target value based on the bit position data; and outputting the extracted bit position as a detection result of a sensor.

The method may further include sequentially extracting second bit positions containing the target values based on the bit position data regenerated in each cycle based on a clock signal, wherein each of the second bit positions is a sequential ordinal bit position closest to the first bit position and containing the target value in each consecutive cycle.

The method may further include converting the input data by initializing, in the bit position data, a bit value of the first bit position extracted in a current cycle; outputting the converted input data to be used in a next cycle; generating a complement of the converted input data, by inverting the bit values of the bit positions of the converted input data and adding a value of 1 to the converted input data which has been inverted; and extracting a second bit position containing the target value, from the bit position data generated based on the converted input data and the complement of the converted input data in a next cycle, wherein the second bit position is an ordinal bit position closest to the first bit position and containing the target value in the next cycle.

The generating the bit position data may include performing a bitwise AND operation on corresponding bit values of the input data and the complement.

BRIEF DESCRIPTION OF THE DRAWINGS

The above and/or other aspects will be more apparent by describing certain exemplary embodiments with reference to the accompanying drawings, in which.

DETAILED DESCRIPTION

Figure 1:
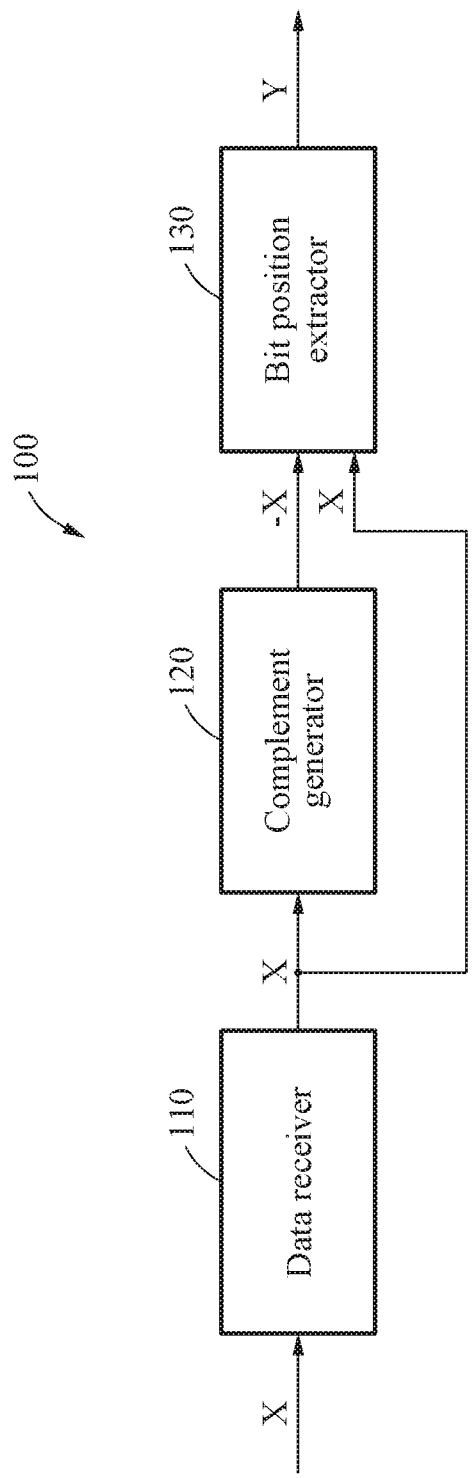
FIG. 1 illustrates an example of a data extraction apparatus according to an exemplary embodiment.

Exemplary embodiments are described in greater detail herein with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In addition, the terms such as "unit", "-er (-or)", and "module" described in the specification refer to an element for performing at least one function or operation, and may be implemented in hardware, software, or the combination of hardware and software.

In a sensor including a plurality of elements, when output data is generated through an arbitration based on a complex tree structure in an analog domain, an increase in a number of bits of input data may cause increases in a depth of a tree, a processing duration, and a size of the sensor. When a complex circuit configured to select all bits of the input data based on a predetermined value in a digital domain, for example, a multiplexer configured to select a predetermined bit is added to a shift register in the sensor, the size of sensor increased in response to the increase in the bits of the input data may cause a difficulty in an implementation based on a single clock cycle and data processing delays.

Hereinafter, an apparatus for extracting data while minimizing a delay will be described.

FIG. 1 illustrates an example of a data extraction apparatus according to an exemplary embodiment.

A data extraction apparatus 100 may be, for example, a circuitry including one or more processors or microprocessors, configured to extract bits or binary digits corresponding to a target value from input data. For example, the data extraction apparatus 100 may be implemented in a sensor including pixels. The sensor may be an event sensor having pixels outputting signals when a predetermined event occurs. For example, the event sensor may be a dynamic vision sensor (DVS) where its pixels output signals when a light intensity changes. Such output signals may be fed into the data extraction apparatus 100 as input data and may indicate the position of pixels where the event occurs. In FIG. 1, the input data is indicated by X. The data extraction apparatus 100 may include a data receiver 110, e.g., a data receiving circuit, a complement generator 120, e.g., a complement generating circuit, and a bit position extractor 130 e.g., a bit position extracting circuit.

The data receiver 110 may receive the input data. The input data may be data including bits in a sequence. For example, the input data may have a value between 0 and $2^N$. Also, a length N of the input data sequence may be, for example, an integer greater than 1. In the input data, a binary value of each bit position i may be 0 or 1, for example, i being an integer between 0 and N−1. When the binary value of the $i^{th}$ bit position is 1, the input data may include $2^i=2^1$, i.e., 2 values. In the input data, a rightmost bit position may indicate a least significant bit (LSB), and a leftmost bit position may indicate a most significant bit (MSB). The input data will be described in detail with reference to FIG. 3.

The complement generator 120 may generate a complement of the input data. In FIG. 1, the complement of the input data is indicated by −X. In the present specification, unless specified as a ones' complement, the complement is a two's complement of a binary system, and also may an opposite (negative) value. When the input data includes N bits, the two's complement of the input data may be a complement of $2^N$. For example, the two's complement of the input data may correspond to a result obtained by subtracting a value of the input data from $2^N$. The result may be a value obtained by inverting binary values 0 and 1 provided in the input data and adding 1 thereto. For example, when the binary values of the input data is "1110", the two's complement of the input data may be "0010".

The bit position extractor 130 may extract a bit position of a target value from the input data based on the input data and the complement. In FIG. 1, the bit position is indicated by Y. The target value may be, for example, a value to be extracted from the input data or a desired value to be extracted from the input data. The bit position of the target value may be a first position relative to an LSB and representing the target value in the input data. For example, when the target value to be extracted is 1, and when the binary values of the input data is "1110", the extracted bit position may be a first position from the LSB. Here, for example, the LSB may be the rightmost bit position which is a zeroth bit position.

The data extraction apparatus 100 may quickly search a plurality of sensors including, for example, an image sensor, based on an event such as a change in light, for a position of a sensor element at which an event occurs, to extract data corresponding to each event, while minimizing or substantially eliminating the delay associated with the processing of information related to the change of state of the sensor elements and expeditiously producing a detection result. Hereinafter, a configuration and an operation of the data extraction apparatus 100 will be described in detail.

Figure 2:
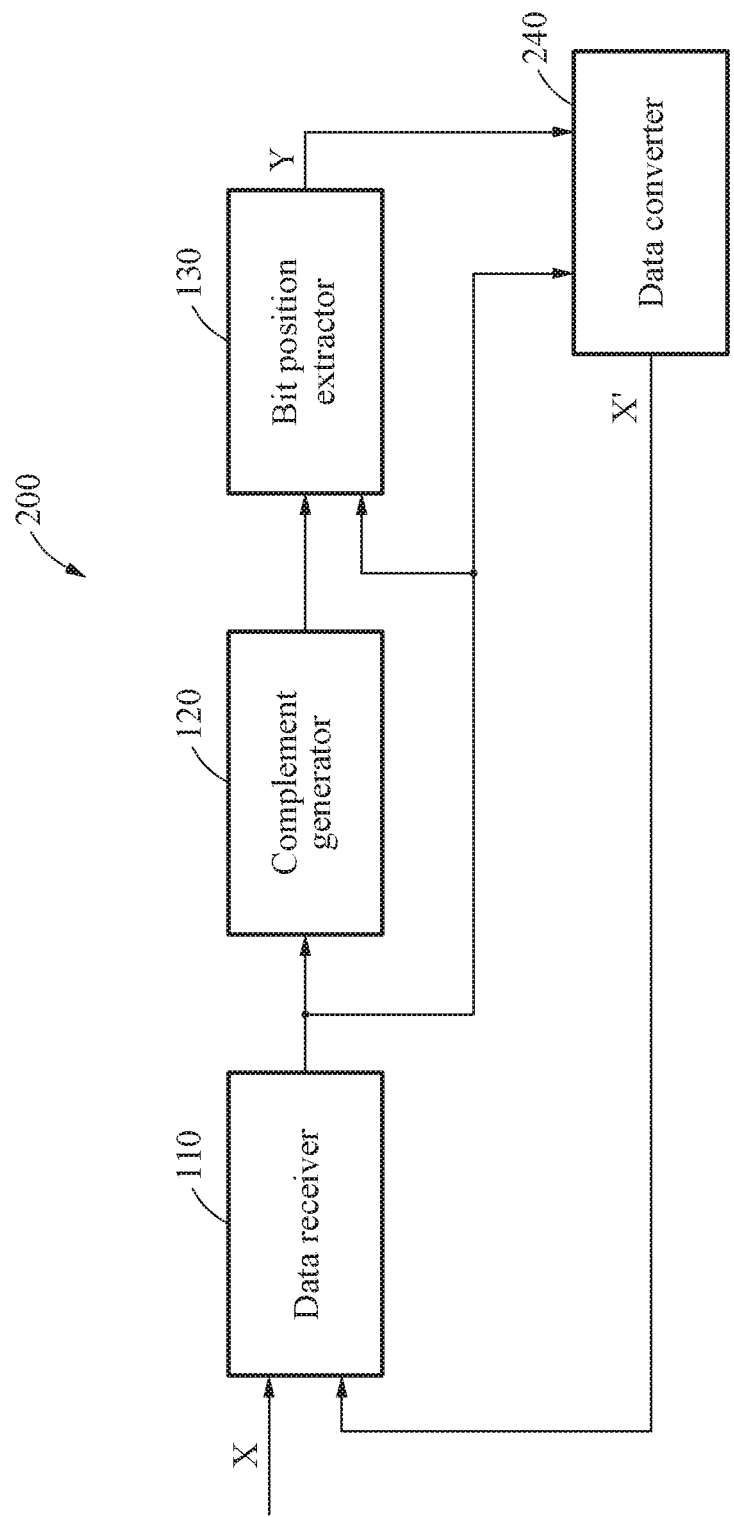
FIGS. 2 and 3 illustrate an example of operating a data extraction apparatus according to an exemplary embodiment.
Figure 3:
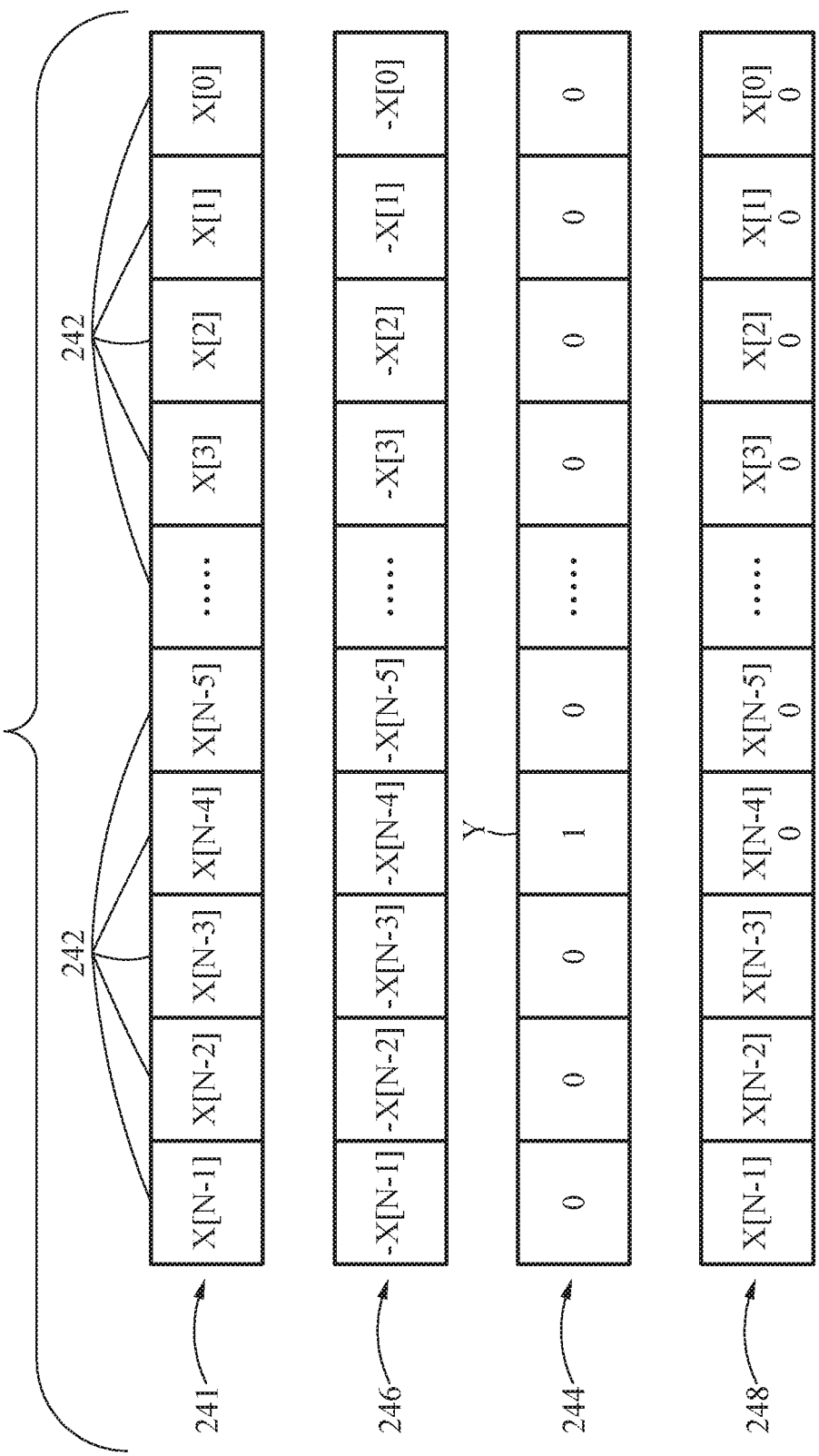

FIGS. 2 and 3 illustrate an example of operating a data extraction apparatus according to an exemplary embodiment.

FIG. 2 illustrates a data extraction apparatus 200 that is similar to the data extraction apparatus 100 and further includes a data converter 240. The data extraction apparatus 200 may sequentially extract a bit position containing a target value, from input data. This bit position may be for example, a position of a sensor element of an event sensor of which an event occurs.

The data receiver 110 may receive input data X and transfer the input data X to the complement generator 120, the bit position extractor 130, and the data converter 240. Also, the data receiver 110 may receive from the data converter 240 converted input data X' into which the input data X is converted by the data converter 240.

In an example, the converted input data X' may be the data in which a value of the bit position is extracted and then initialized. The data receiver 110 may transfer the converted input data X' to the complement generator 120, the bit position extractor 130, and the data converter 240 and form a loop such that the data extraction apparatus 200 sequentially extracts the bit position of the target value from the input data. For example, when the input data X is initially received, the data receiver 110 may directly transfer the corresponding input data X. Subsequently, the data receiver 110 may receive one or more sets of converted input data X' that is sequentially initialized and transfer the converted input data X', until all bit positions corresponding to the target value present in the input data X are extracted.

The complement generator 120 may generate a complement of the input data X and the converted input data X' transferred from the data receiver 110. For example, the complement generator 120 may generate a first complement −X of the input data X when the input data X is received, and may generate a second complement −X' of the converted input data X' when the converted input data X' is received. For example, the complement generator 120 may invert each bit of the input data X or the converted input data X' and add 1 to a result. In this example, when a value of a bit position is 0, the complement generator 120 may invert the corresponding bit by changing 0 to 1, and, when a value of a bit position is 1, the complement generator 120 may invert the corresponding bit by changing 1 to 0. Then, a value of 1 is added to an inverted value. An operation of the complement generator 120 will be described in greater detail with reference to FIG. 5.

The bit position extractor 130 may extract the bit position of the target value based on the input data X and the first complement −X, or the converted input data X' and the second complement −X' according to Equation 1 below.

With reference to FIG. 3, it is assumed that the input data X (reference numeral 241) includes a sequence of N bits 242, for example, having values X[N−1], X[N−2], X[N−3], X[N−4], X[N−5], . . . , X[3], X[2], X[1], and X[0]. Here, X[i] may represent a binary value of an $i^{th}$ bit position from an LSB, i being an integer between 0 and N−1. In FIG. 3, it is assumed that binary values of X[N−5] through X[0] are 0s and X[N−4] represents a first bit from the LSB having a binary value of 1. A bit position Y may be extracted from the bit position data (reference numeral 244) in which a rightmost bit of the target value, 1 in an example of FIG. 3, is maintained as in the input data X, and the remaining bits are changed to have non-target values, 0s in the example of FIG. 3.

$$Y = X \& (-X) \qquad \text{[Equation 1]}$$

In Equation 1, X denotes input data, -X denotes a first complement of the input data X, Y denotes a rightmost bit position of a target value, and & denotes a bitwise AND operation. According to Equation 1, the bitwise AND operation is applied by multiplying values of each pair of corresponding bits of the input data X and the first complement -X (reference numeral 246), wherein if both bits in the compared bit position are 1, the bit in the resulting binary representation is 1 (1×1=1); otherwise, the result is 0 (1×=0 and 0×0=0). Thus, the bit position data 244 corresponding to a bitwise AND operation result may indicate that the target value 1 of the rightmost bit position Y is maintained and values of the remaining bit positions are changed to the non-target values, e.g., 0s. As illustrated in FIG. 3, only the bit position Y corresponding to a first bit position (N-4) having a value of 1 in the input data, in a direction from the LSB to the MSB, for example, a rightmost bit position containing a target value, has a value of 1. The bit positions corresponding to the other bits may be 0. Thus, based on Equation 1, the data extraction apparatus 200 may acknowledge and extract a value of a first bit position from the LSB corresponding to the target value, for example, 1.

In FIG. 3, since an (N-4)$^{th}$ bit position from the LSB is a rightmost bit position having the target value, bit values X[N-5] through X[0] are 0s. The input data X and the first complement -X may have a relationship that a result is 0 when an addition is applied therebetween. Since -X[0] through -X[N-5] of the first complement -X are 0s and -X[N-4] has the same value as that of X[N-4] of the input data X, a carry-over may occur. Thus, -X[N-3] through -X[N-1] of the first complement -X (reference numeral 246) may be ones' complements of X[N-3] through X[N-1] of the input data X, respectively. Also, the carry over occurring in X[N-4]+(-X[N-4]) may be 1 for a two's complement.

The relationship between the input data X and the first complement -X may have a characteristic that the bits from the LSB to the first bit having a value of 1 in a direction to the MSB, e.g., X[N-4], have the same value, 0, the bits X[N-4] and -X[N-4] have the same value of 1, and remaining upper bits have values inverted with respect to each other. Due to this characteristic, the bit position Y calculated by applying a bitwise AND operation to the input data X and the first complement -X according to Equation 1 may be a rightmost bit position corresponding to a value of 1, for example, a bit position closest to the LSB. The bit position Y may correspond to a decimal value of the first bit of 1 from the LSB. When the first bit of 1 from the LSB is an m$^{th}$ bit from the LSB, the extracted bit position Y may be 2$^m$, m being an integer between 0 and N-1. In an example of FIG. 3, the bit position Y is 2$^{(N-4)}$.

To quicker output or identify bits corresponding to a target value, for example, 0 or 1 from a plurality of bits in the input data X, the data extraction apparatus 200 may extract the bit position Y of the target value, by sequentially outputting the target values of corresponding bit positions, thereby the delay associated with the processing of information is minimized or substantially eliminated, as compared to the related art apparatuses performing similar functions.

After extracting the bit position Y of the target value from the input data X, the data converter 240 may initialize a value of the extracted bit position and convert the input data X. For example, the data converter 240 may generate the converted input data X' (reference numeral 248) according to Equation 2.

$$X' = X \text{ xor } Y \quad \text{[Equation 2]}$$

In Equation 2, X denotes input data, Y denotes a bit position, X' denotes converted input data, and xor denotes a bitwise exclusive OR (XOR). In Equation 2, the converted input data X' may be a result of the bitwise XOR operation performed on the bit position data 244 and the input data X. The XOR operation performs the logical exclusive OR operation on each pair of corresponding bits of the bit position data 244 and the input data X. The result in each position is 1 if only the first bit of the pair is 1 or only the second bit is 1, and is 0 if both bits are 0 or both bits are 1. Thus, a value of the rightmost bit position of 1 from the LSB in the input data X is converted to 0 and the upper bits and the lower bits of the converted input data X' remain the same as the upper bits and the lower bits of the input data X (or the converted data X') processed in the current cycle. Thus, the data extraction apparatus 200 may exclude from the further processing the bit position Y having value of 1 that has been extracted in the current cycle, according to Equation 2.

In an example, the data converter 240 may provide the converted input data X' to the data receiver 110 as a feedback according to Equation 2. When the data receiver 110 provides the converted input data X' to the complement generator 120, the bit position extractor 130, and the data converter 240, the data extraction apparatus 200 may use the converted input data X' as the subsequent input data. The data extraction apparatus 200 may consecutively and repetitively perform a series of processes for extracting a bit position from the converted input data X', thereby sequentially extracting the rightmost bit position containing the target value, thereby the delay associated with the processing of information is substantially minimized. The data extraction apparatus 200 may repetitively perform a series of processes for extracting the bit position Y until the converted input data X' is all 0s or until all of the bit positions corresponding to a value of 1 in the initial input data X are output. Thus, the data extraction apparatus 200 may consecutively output the decimal value of the bit position having a value of 1, thereby the delay associated with the processing of information is substantially minimized.

Figure 4:
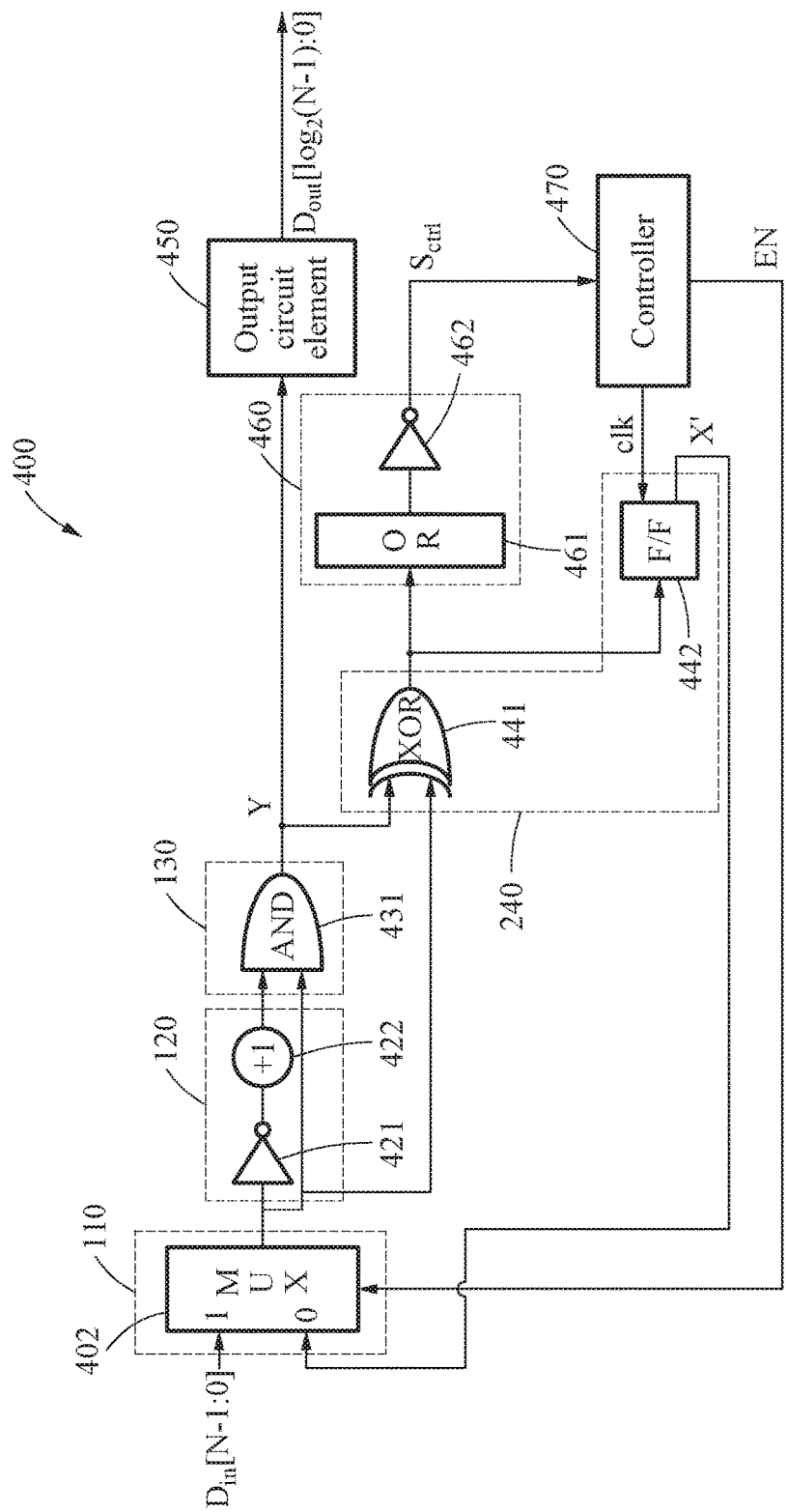
FIG. 4 illustrates an example of a data extraction apparatus according to an exemplary embodiment.

FIG. 4 illustrates an example of a data extraction apparatus according to an exemplary embodiment.

FIG. 4 is a circuit diagram of a gate level of a data extraction apparatus 400 which is similar to the data extraction apparatuses 100 and 200 described above.

The data receiver 110 may include a multiplexer (MUX) 402. In response to an enable signal EN transferred from a controller 470, the MUX 402 may transfer one of data $D_{in}$[N-1:0], i.e., the input data X, and converted input data X' on which a data conversion is performed to the complement generator 120, the bit position extractor 130, and the data converter 240. For example, the MUX 402 may transfer data $D_{in}$ when 1 is transferred from the controller 470 as the enable signal EN, and may transfer the converted input data X' when 0 is transferred as the enable signal EN. When the data $D_{in}$ is initially received, the MUX 402 may transfer the data $D_{in}$ as input data X. Once a bit position Y is extracted, the MUX 402 may transfer the converted input data X' as input data until all bit positions corresponding to a target value are extracted from the data $D_{in}$.

The complement generator 120 may include a NOT gate 421 configured to perform a bitwise NOT operation on the input data X and an adder 422 configured to add a value of 1 to input data obtained through a NOT operation. The NOT gate 421 may perform a bit invert function and produce a 1 as an output if a corresponding input is 0 and produce a 0 output if a corresponding input is 1.

The complement generator 120 may generate a two's complement −X of the input data X based on the NOT operation and the addition of 1.

The bit position extractor 130 may include an AND gate 431 configured to perform a bitwise AND operation on the input data X and the complement −X. The bit position extractor 130 may generate the bit position data 244 by applying the bitwise AND operation to the input data X and the complement −X according to equation 1. As a result, the bit position extractor 130 may extract a rightmost bit position of the target value provided in the input data X.

The data converter 240 may include an XOR gate 441 configured to perform a bitwise XOR operation on the input data X and the extracted bit position Y. The data converter 240 may generate the converted input data X' by applying the bitwise XOR operation to the input data X and the bit position data 244. The data converter 240 may further include a flip flop (F/F) 442. The constructions of the flip-flop circuits are known to those skilled in the art and, thus, a detailed description will be omitted. The data converter 240 may transfer the converted input data X' to the MUX 402 using the flip flop 442 in a subsequent clock cycle. The flip flop 442 receives a clock signal clk from the controller 470 which may include one or more processors or microprocessors.

The data extraction apparatus 400 may further include an output circuit element 450, and a termination determining circuit element 460.

The output circuit element 450 may output the extracted bit position Y. For example, the output circuit element 450 may output the extracted bit position data 244 as a binary log value, for example, $D_{out}[\log_2(N-1):0]$. For example, when an $m^{th}$ bit from an LSB is a first bit corresponding to the target value, the extracted bit position Y may have a value of $2^m$, and the output circuit element 450 may output m which is a binary log value of a value of the corresponding bit position Y. Also, m may be output as $\log_2(N-1)+1$ bits, for example, $D_{out}[\log_2(N-1)]$, $D_{out}[\log_2(N-1)-1]$, ..., $D_{out}[2]$, $D_{out}[1]$, and $D_{out}[0]$. With respect to the bit position Y of the target value, the output circuit element 450 may output a two's exponentiation value of a corresponding bit position once in every clock cycle.

The termination determining circuit element 460 may generate a termination signal $S_{ctrl}$ in response to a determination that all bit positions corresponding to the target value that are present in the input data X are extracted. The termination determining circuit element 460 may include an OR gate 461 configured to perform a bitwise OR operation and a NOT gate 462 configured to invert an output of the OR gate 461. The OR gate 461 performs the logical inclusive OR operation on each pair of corresponding bits. The result in each position is 0 if both bits are 0, while otherwise the result is 1. For example, when all bit positions corresponding to 1 are extracted from the input data X, all bits included in an output of the data converter 240 may be 0. When all bits of the converted input data X' are 0s, an output of the OR gate 461 included in the termination determining circuit element 460 may be 0 and thus, an output of the NOT gate 462 may be 1. The termination determining circuit element 460 may transfer the generated termination signal $S_{ctrl}$ to the controller 470.

The controller 470 may be, for example, a module configured to control an overall operation of the data extraction apparatus 400. The controller 470 may generate the enable signal EN by determining that all of the target values are extracted from the data $D_{in}$ in response to the termination signal $S_{ctrl}$ generated by the termination determining circuit element 460, and apply a clock cycle clk to the data extraction apparatus 400, to start processing a new set of the input data $D_{in}$. In an example, the controller 470 may apply the enable signal EN during only one cycle, i.e., an initial cycle, starting from a time at which the data $D_{in}$ is received. Through this, the controller 470 may control the MUX 402 to use the data $D_{in}$ as an input of the data extraction apparatus 400 only once, in an initial cycle. The controller 470 may control the MUX 402 to use the converted input data X' corresponding to an output of the flip flop 442 as the input data from a subsequent cycle until the termination signal $S_{ctrl}$ has a value of 1.

As discussed above, the data receiver 110, the complement generator 120, the bit position extractor 130, the data converter 240, the output circuit element 450, the termination determining circuit element 460, and the controller 470 may be implemented by, for example, various logical gates, circuitry elements, electrical elements, analog elements, and digital elements. Also, the NOT gate, the OR gate, the XOR gate, and the adder may be implemented by various circuitry elements.

Figure 5A:
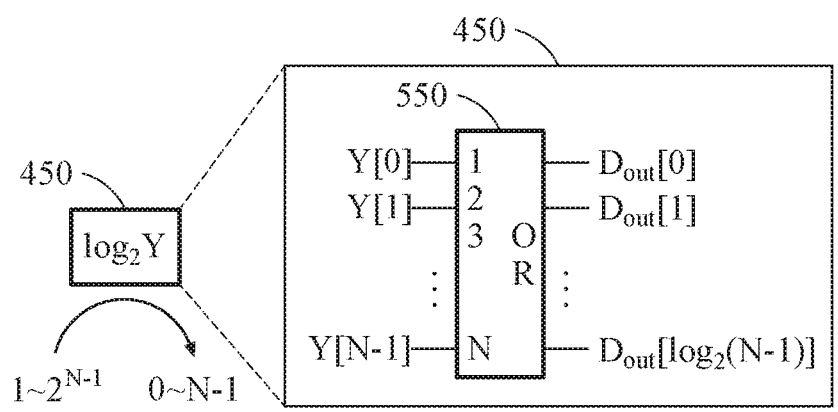
FIGS. 5A and 5B illustrate an example of an output circuit element according to an exemplary embodiment.
Figure 5B:
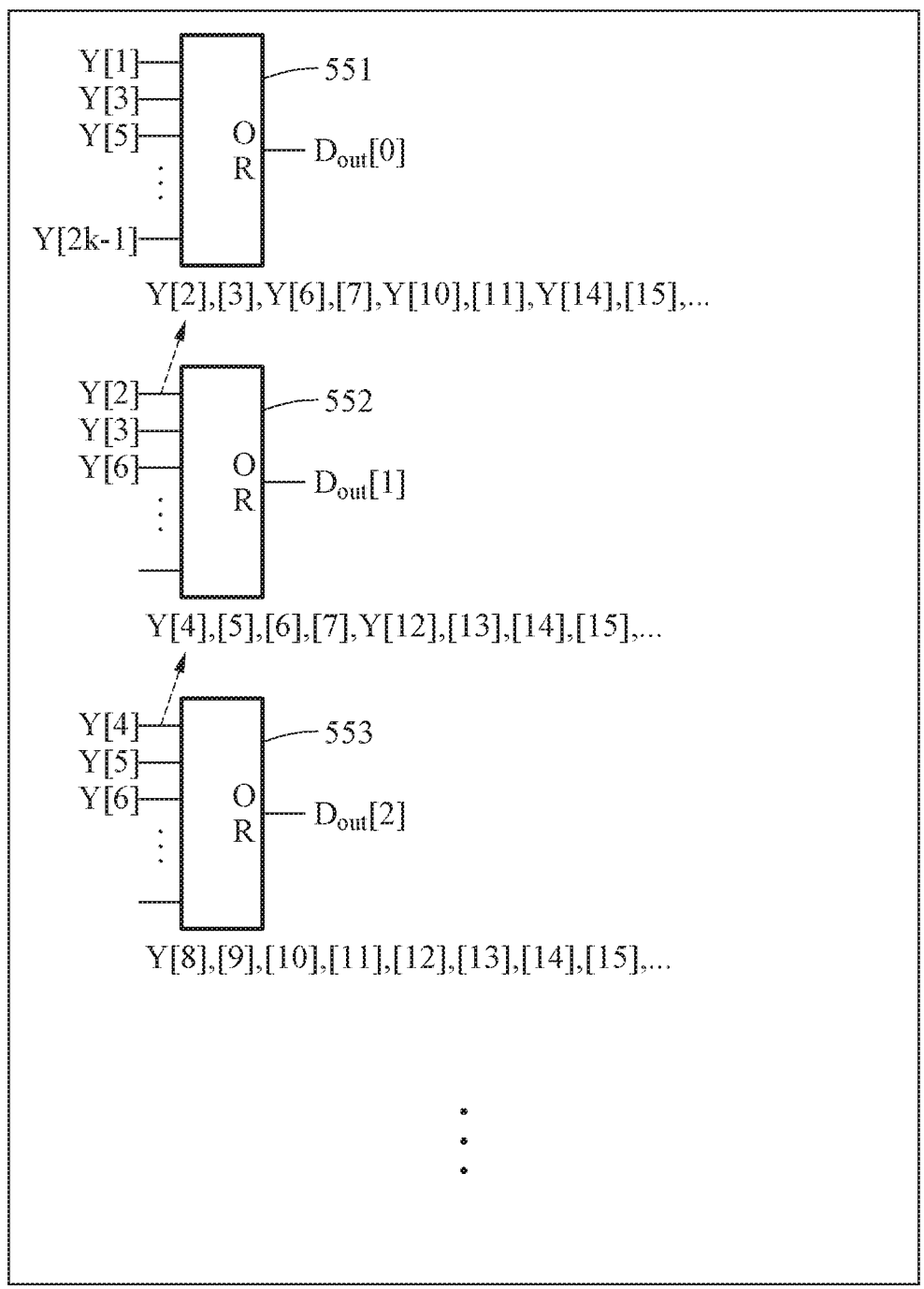

FIGS. 5A and 5B illustrate an example of an output circuit element according to an exemplary embodiment.

The output circuit element 450 may output a bit position Y of a value between 1 and $2^{N-1}$ as a binary log value, for example, $\log_2 Y$. The binary log value $\log_2 Y$ may have a value between 0 and N−1. Thus, the output circuit element 450 may output the bit position Y which is decimal value of a first bit corresponding to a target value from an LSB in a direction to an MSB as a binary log. In this example, the binary log value $\log_2 Y$ may indicate an ordinal position of a bit corresponding to the target value from the LSB.

As illustrated in FIG. 5A, a logarithmic function for converting the bit position Y into the binary log value $\log_2 Y$ may include an OR gate 550. The OR gate 550 of the output circuit element 450 may receive the bit position Y from Y[N−1] to Y[0] based on a unit of bit and output the binary log value $\log_2 Y$ from $D_{out}[\log_2(N-1)]$ to $D_{out}[0]$ based on a unit of bit.

As illustrated in FIG. 5B, the output circuit element 450 may include, for example, a first OR gate 551, a second OR gate 552, a third OR gate 553 etc. However, a node connection type of an OR gate and a number of OR gates are not limited to the aforementioned example.

The first OR gate 551 may output a zeroth bit $D_{out}[0]$ when the bit position Y is expressed by a binary log value using $(2k-1)^{th}$ bits of the bit position Y as an input where k=1, 2, 3, ..., ⌊N/2⌋. ⌊x⌋ is a floor operation that expresses an integer less than or equal to x, x being a real number, and may be calculated as, for example, ⌊1/2⌋=0 and ⌊3/2⌋=1. For example, when the input data X is "01100", the bit position Y corresponding to a first position may be output as "00100" which is 4 (=$2^2$) in a decimal system and also may be expressed as, for example, Y[4]=0, Y[3]=0, Y[2]=1, Y[1]=0, and Y[0]=0. In this example, since N=5 and 2k−1=1 and 3, and thus the first OR gate 551 has inputs Y[3] and Y[1] which are 0, and the zeroth bit $D_{out}[0]$ may be output as 0.

The second OR gate 552 may output a first bit $D_{out}[1]$ when the bit position Y is expressed by the binary log value using, for example, $2^{nd}$ and $3^{rd}$ bits, $6^{th}$ and $7^{th}$ bits, $10^{th}$ and $11^{th}$ bits, and $14^{th}$ and $15^{th}$ bits, etc. of the bit position Y as an input. In the foregoing example where N=5, since Y[2]=1 and Y[3]=0, the first bit $D_{out}[1]$ may be output as 1.

The third OR gate 553 may output a second bit $D_{out}[2]$ when the bit position Y is expressed by the binary log value using, for example, $4^{th}$, $5^{th}$, $6^{th}$, and $7^{th}$ bits and $12^{th}$, $13^{th}$, $14^{th}$, and $15^{th}$ bits and $20^{th}$ and $21^{st}$ bits etc of the bit position Y as an input. In the foregoing example where N=5, since Y[4]=0, the second bit $D_{out}[2]$ may be output as 0.

In the foregoing example, since the first bit $D_{out}[1]$ of the binary log value $D_{out}$ is 1, an ordinal number may be 2 (=$2^1$). Thus, the binary log value $D_{out}$ may indicate that a second bit position from the LSB corresponds to the target value.

As such, a range of binary log value may increase based on the number of OR gates. A $w^{th}$ bit of the binary log value may be an output of an OR gate using $$(2^{w+1}) \cdot \left\lfloor \frac{u}{2^w} \right\rfloor + u\%(2^w) + (2^w)$$

bits of the bit position Y as an input, w and u being an integer greater than or equal to 0. Here, % is a modulo (mod) operation calculated as, for example, 10%4=2. The number of OR gates 550 is not limited to an example described with reference to FIG. 5 and thus, may vary based on a range of binary log value to be output.

Figure 6:
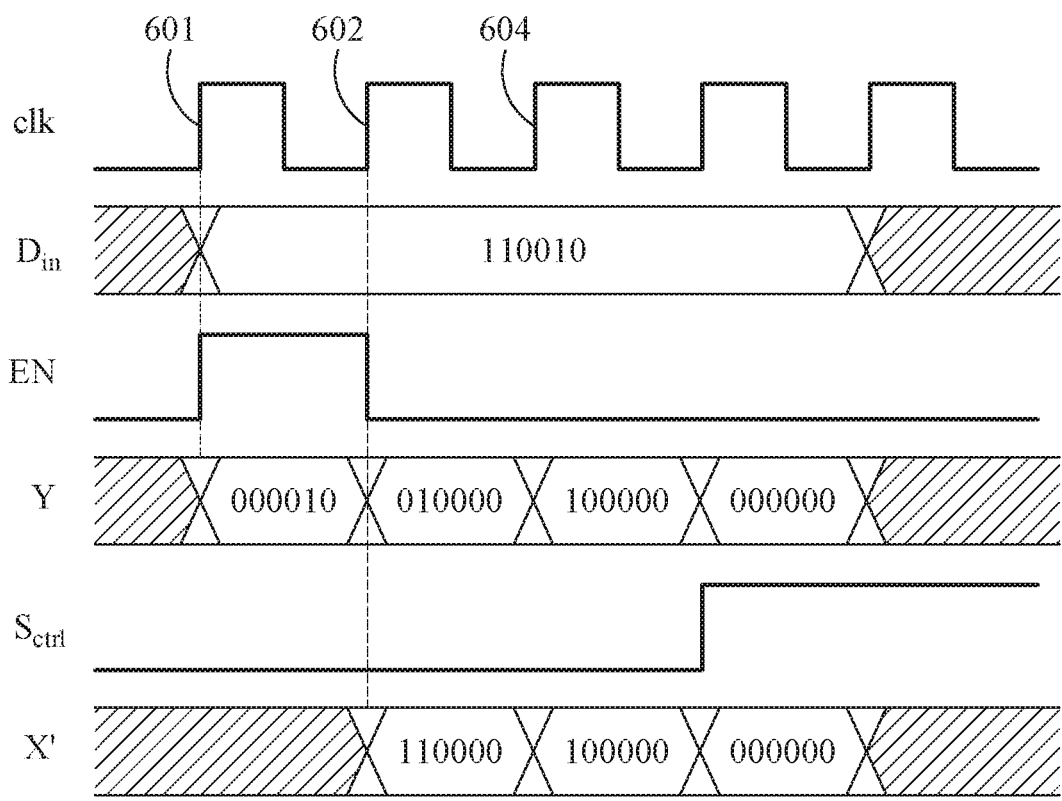
FIG. 6 illustrates an example of data according to an exemplary embodiment.

FIG. 6 is a diagram illustrating data values varying in the data extraction apparatus 400 of FIG. 4 based on a unit of clock cycle, according to an exemplary embodiment.

The data receiver 110 may receive, for example, "110010" as input data X. In response to an enable signal EN, the data receiver 110 may transfer "110010" to the complement generator 120, the bit position extractor 130, and the data converter 240 as the input data X. The bit position extractor 130 may extract 1 of a rightmost position corresponding to a first position from an LSB, from "110010" of the input data X in a first clock cycle 601. In the first clock cycle 601, the data converter 240 may determine a value of the converted input data X' to be "110000" and transfer the converted input data X' to the data receiver 110 in a second clock cycle 602.

In a second clock cycle 602, since the enable signal EN is 0, the data receiver 110 may transfer the converted input data X' "110000" to the complement generator 120, the bit position extractor 130, and the data converter 240. The bit position extractor 130 may extract 1 of a rightmost position corresponding to a fourth position from "110000" of the converted input data X' in the second clock cycle 602. In a third clock cycle 604, the data converter 240 may determine the value of the converted input data X' to be "100000", and transfer the converted input data X' to the data receiver 110.

In the third clock cycle 604, since the enable signal EN is 0, the data receiver 110 may transfer "100000" corresponding to the value of the converted input data X' to the complement generator 120, the bit position extractor 130, and the data converter 240. The bit position extractor 130 may extract 1 of a rightmost position corresponding to a fifth position from "100000" of the converted input data X' in the third clock cycle 604. In a third clock cycle 604, the data converter 240 may determine the value of the converted input data X' to be "000000". In this example, since values of all bits are 0s, the termination determining circuit element 460 may determine a value of the termination signal $S_{ctrl}$ to be 1. In response to the termination signal $S_{ctrl}$, the controller 470 may determine that extractions with respect to the previously received input data X are complete and generate the EN signal to start processing a new set of input data.

In the related art apparatus, the retrieval is performed on all of the received bits, for example, on bits "110010," and, thus, about six clock cycles may be needed to process the input data. However, the data extraction apparatus according to an exemplary embodiment may extract all target values from six bits of the input data within three clock cycles. The aforementioned process of FIG. 6 is described as an example and thus, is not limiting.

Figure 7:
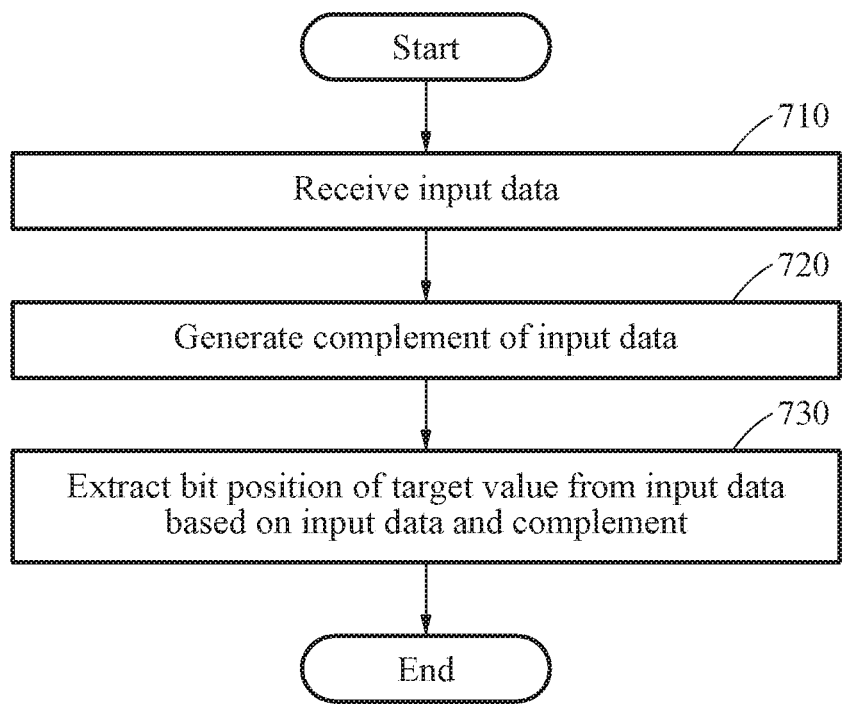
FIGS. 7, 8, 9, and 10 illustrate examples of a data extraction method according to an exemplary embodiment.
Figure 8:
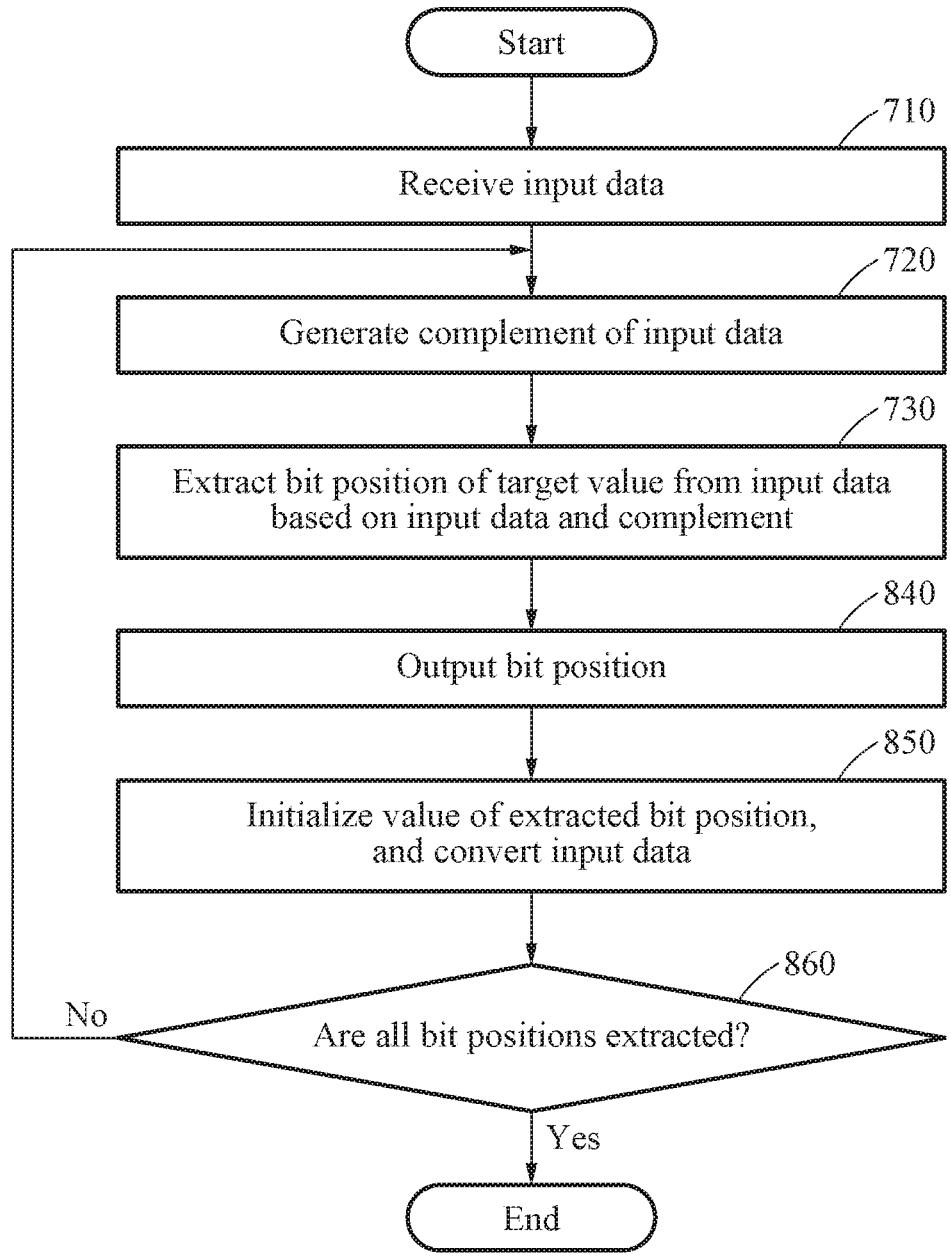
Figure 9:
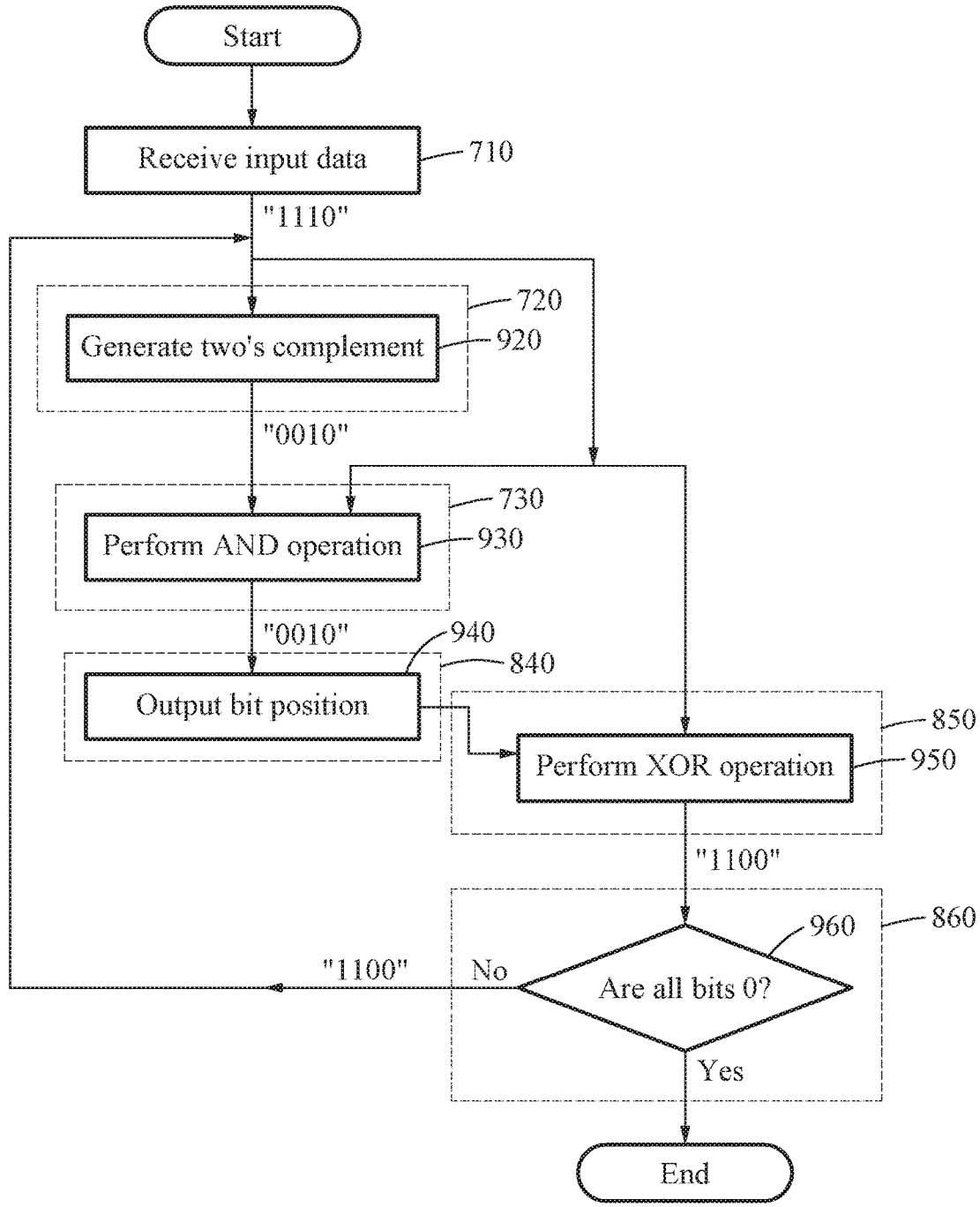

FIGS. 7 through 9 are flowcharts illustrating example of a data extraction method performed by a data extraction apparatus according to an exemplary embodiment.

In operation 710, a data receiver may receive input data. As described with reference to FIGS. 1 through 6, the data receiver may use input data converted in a current clock cycle as input data of a subsequent clock cycle.

In operation 720, a complement generator may generate a complement of the input data. As described with reference to FIGS. 1 through 6, the complement generator may generate the complement of the input data by performing a bitwise operation on the input data.

In operation 730, a bit position extractor may extract a bit position of a target value from the input data based on the input data and the complement. As described with reference to FIGS. 1 through 6, the bit position extractor may extract the bit position through the bitwise operation based on the input data and the complement. The bit position extractor may extract a rightmost bit position of the target value in the input value.

As illustrated in FIG. 8, in operation 840, an output circuit element may output the bit position. The output circuit element may output the bit position as a binary log value as an example. However, an exemplary embodiment is not limited thereto.

In operation 850, a data converter may initialize a value of the extracted bit position, and convert the input data. For example, the data converter may perform an XOR operation on the input data and the bit position.

In operation 860, a termination determining circuit element may determine whether all bit positions are extracted. Here, the termination determining circuit element may generate a termination signal in response to a determination that all bit positions corresponding to the target value are extracted from the input data (YES in operation 860), and the data extraction apparatus may terminate an operation. When not all of the bit positions are extracted (NO in operation 860), the data extraction apparatus may return to operation 820 and use the input data converted in operation 850 to generate the complement. In an example, the data extraction apparatus may sequentially extract a bit position of the target value from the input data until all of the bit positions are extracted. When not all of the bits are 0, the converted input data may be provided as a feedback to be used in operations 720, 730, and 850.

For example, in operation 720 of FIGS. 7 and 8, the complement generator may generate a complement of the converted input data when not all of the bit positions are extracted in operation 860, and when the converted input data is received in a subsequent clock cycle. Subsequently, in operation 730, the bit position extractor may extract a bit position of a target value from the converted input data using the complement of the converted input data.

In an example of FIG. 9, the data receiver may receive input data "1110" and transfer the received input data.

In operation 920, the complement generator may generate a two's complement and the complement of the input data "1110" may be "0010".

In operation 930, the bit position extractor may perform a bitwise AND operation on the input data and the complement. A result of the bitwise AND operation performed on the input data "1110" and the complement "0010" may be "0010".

In operation 940, an output circuit element may output the bit position. The output circuit element may output the bit position as a binary log value as an example.

In operation 950, a data converter may initialize a value of the extracted bit position, and convert the input data. For example, the data converter may perform an XOR operation on the input data and the bit position. In this example, a result of the XOR operation performed on the input data "1110" and the bit position "0010" may be "1100".

In operation 960, a termination determining circuit element may determine whether all bit positions are extracted. When not all of the bit positions are extracted, the data extraction apparatus may return to operation 920 and use the input data converted in operation 950 corresponding to the input data "1100" to generate the complement. The data extraction apparatus may sequentially extract a bit position of the target value from the input data until all of the bit positions are extracted. In operation 960, when not all of the bits are 0, the converted input data "1100" may be provided as a feedback and to be used as an input in operations 920, 930, and 950.

Figure 10:
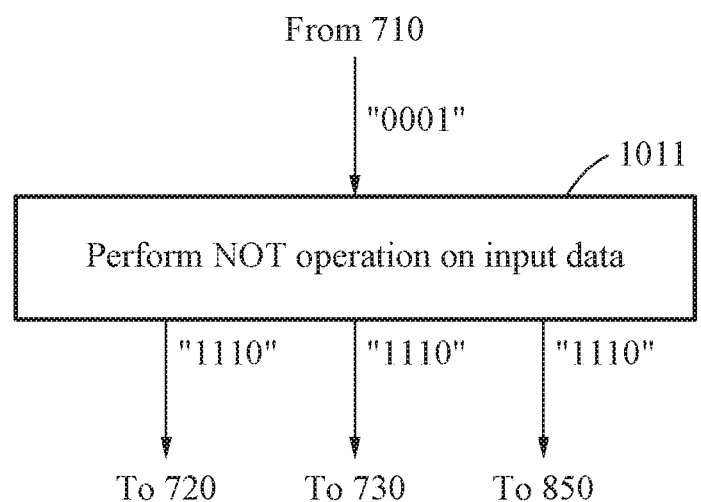

FIG. 10 is a flowchart illustrating a data extraction method when a target value is set to be 0.

In operation 1011, a data receiver may perform a NOT operation on input data. In an example, the data receiver may perform a bitwise NOT operation on the input data, and transfer input data obtained through the bitwise NOT operation to a complement generator, a bit position extractor and a data converter. For example, when input data "0001" is received, the data receiver may provide data "1110" into which the input data "0001" is inverted to be used in operations 720, 730, and 850.

For example, by performing the NOT operation on the input data, the data extraction apparatus may sequentially extract bit positions corresponding to 0 from the input data.

Figure 11:
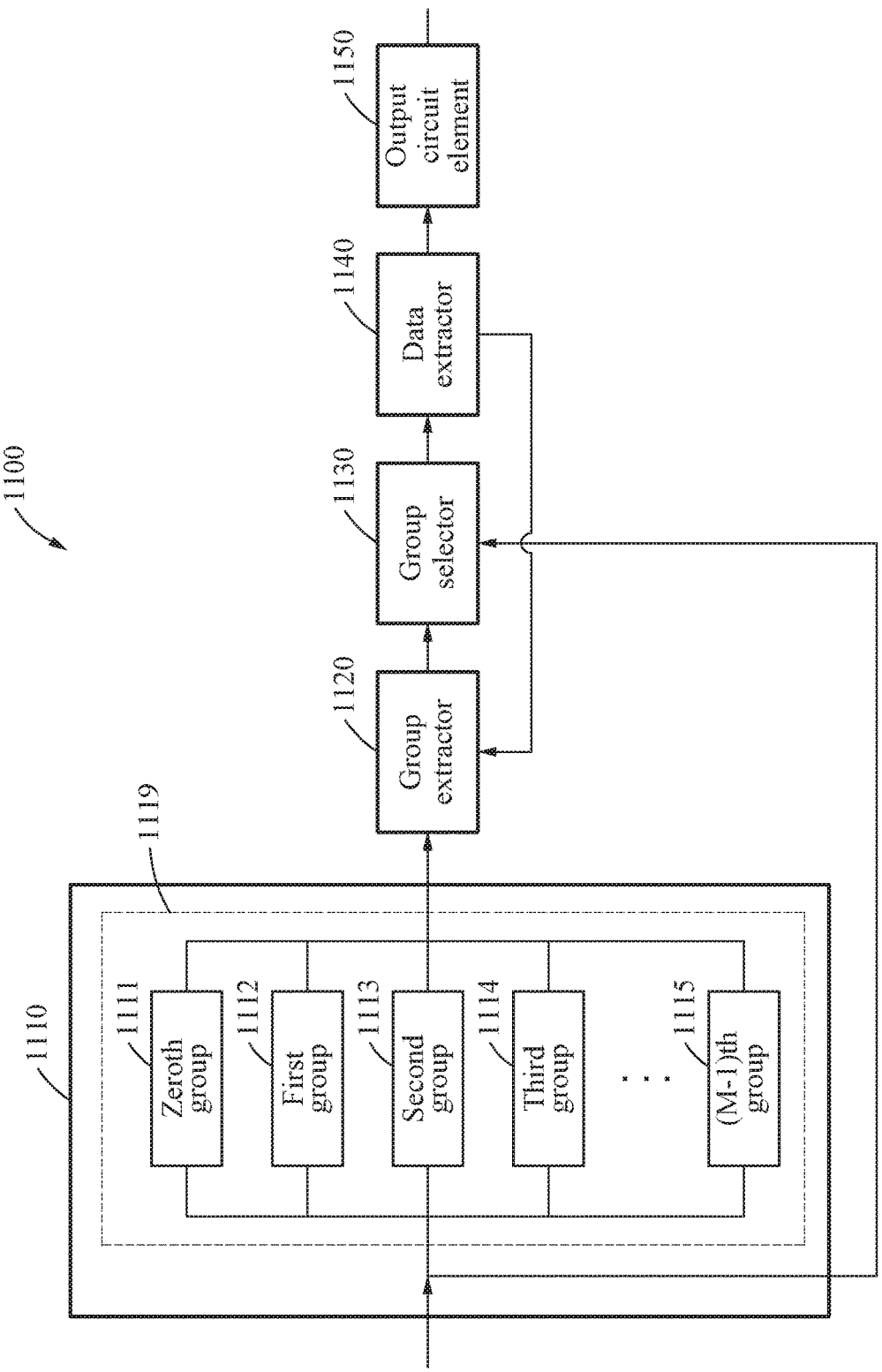
FIG. 11 illustrates an example of a group-based data extraction apparatus according to an exemplary embodiment.

FIG. 11 illustrates an example of a group-based data extraction apparatus according to an exemplary embodiment.

A group-based data extraction apparatus 1100 may be a circuitry including one or more processors or microprocessors, and may be implemented in a sensor, and may process input data through a classification into a group. To calculate a two's complement from the input data, an adder may be used to add 1 to a value obtained by inverting the input data and thus, a size of the adder may increase according to an increase in the number of bits. To reduce the size of the data extraction apparatus, the group-based data extraction apparatus 1100 may group the input data into a group including the predetermined number of bits and input the grouped data to the data extraction apparatus described with reference to FIGS. 1 through 10.

The group-based data extraction apparatus 1100 may include an information receiver 1110, a group extractor 1120, a group selector 1130, a data extractor 1140, and an output circuit element 1150.

The information receiver 1110 may receive input data, group the input data into groups, and provide groups of input data to the group selector 1130. The information receiver 1110 may include a group generator 1119.

The group generator 1119 may classify the input data into a plurality of groups to generate group data. In an example, the group generator 1119 may classify bits included in the input data into the plurality of groups. In the case "1" is a target value and at least one of the bits representing 1 is included in a group, a group value of the corresponding group may be output as 1. For example, the group generator 1119 may generate M groups, each including j bits based on the input data. Here, each of M and j may be an integer greater than or equal to 1 and, for example, $M=N/j$. The group generator 1119 may apply a bitwise OR operation on the j bits included in each of the M groups. When at least one bit representing 1 is present, the group generator 1119 may determine a group value of a corresponding group to be 1. When a bit representing 1 is absent, the group generator 1119 may determine a group value of a corresponding group to be 0. Group data may be data including a sequence of group values in series for each group. The group data may include sequences of group values, for example, in an order of values of an $(M-1)^{th}$ group 1115, . . . , values of a third group 1114, values of a second group 1113, values of a first group 1112, and values of a zeroth group 1111.

The group extractor 1120 may extract a group bit position of a target group value from the group data. The target group value may indicate a value for identifying a group including at least one bit of a target value, for example, 1. The group bit position may represent a value indicating the group including at least one bit of the target value. An extraction of the group bit position may be performed similarly to the extraction of the bit position described with reference to FIGS. 1 through 10. For example, under an assumption that four groups are generated, when each of the third group 1114 and the second group 1113 includes 1, and the first group 1112 and the zeroth group 1111 do not include 1, the group data may be expressed as "1100". The group extractor 1120 may extract a value "0100" to indicate a rightmost group bit position of the target group value, from the group data. Here, the value "0100" may indicate, for example, that the group bit position is a second position from an LSB. The group extractor 1120 may be provided in a structure similar to that of the data extraction apparatus described with reference to FIGS. 1 through 10.

The group selector 1130 may select a group based on the group bit position, and select partial data corresponding to the selected group from the input data. For example, when the group data is "1100", the group selector 1130 may select the second group 1113, to be a group corresponding to the group bit position data "0100". Also, the group selector 1130 may select bits corresponding to the second group 1113 to be the partial data and transfer the partial data to the data extractor 1140.

The data extractor 1140 may sequentially extract a bit position of a target value from the partial data corresponding to the selected group. For example, the data extractor 1140 may be provided in a structure similar to that of the data extraction apparatus described with reference to FIGS. 1 through 10. In an example, the data extractor 1140 may sequentially extract the bit position of the target value from the partial data based on the data extraction described with reference to FIGS. 1 through 10, thereby providing the bit position to the output circuit element 1150 which may be implemented similarly to the output circuit element 450 described above.

The output circuit element 1150 may output the bit position extracted by the data extractor 1140. The output circuit element 1150 may output a group, for example, the group bit position, selected in a current clock cycle and a bit position of a target value present in the input data of the corresponding group. Here, the output circuit element 1150 may output the bit position as a binary log.

Subsequently, the group extractor 1120 may extract a subsequent group bit position of the target group value, e.g., data containing "1000" in the above example, in response to a determination that the data extractor 1140 extracts all bit positions of the target value from the partial data, e.g., from the input data included in the second group. For example, when all target values are extracted from one group, the data extractor 1140 may transmit a termination signal to the group extractor 1120. In response to the termination signal, the group extractor 1120 may initialize a bit indicating a first target group value, i.e., of the second group 1113 in the above example, and extract a group bit position of a second target group value, i.e., of the third group 1114 in the above example. When the group selector 1130 selects partial data belonging to a group corresponding to the second group bit position, the data extractor 1140 may output bit positions corresponding to a value of 1 in the selected partial data, i.e., in the input data included in the third group 1114 in the above example.

For example, the group-based data extraction apparatus 1100 may sequentially output the bit position by repetitively outputting the bit position until outputs of all groups are 0. Thus, when the number of bits in the input data is relatively large, the group-based data extraction apparatus 1100 may operate as a shift register by grouping the input data, while the delay associated with the processing of information is substantially minimized.

Elements included in the group-based data extraction apparatus 1100 such as the information receiver 1110, the group extractor 1120, the group selector 1130, and the data extractor 1140 may be implemented by, for example, various logical gates, circuitry elements, electrical elements, analog elements, and digital elements. Also, the information receiver 1110, the group extractor 1120, the group selector 1130, and the data extractor 1140 may each be implemented in a separate processor or microprocessor or some or all of the information receiver 1110, the group extractor 1120, the group selector 1130, and the data extractor 1140 may be implemented to share a processor or microprocessor.

The above-described exemplary embodiments may be recorded in non-transitory computer-readable media including program instructions to implement various operations which may be performed by a computer. The media may also include, alone or in combination with the program instructions, data files, data structures, and the like. The program instructions recorded on the media may be those specially designed and constructed for the purposes of the exemplary embodiments, or may be available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The media may be transfer media such as optical lines, metal lines, or waveguides including a carrier wave for transmitting a signal designating the program command and the data construction. Examples of program instructions include both machine code, such as code produced by a compiler, and files containing higher level code that may be executed by the computer using an interpreter. The described hardware devices may be configured to act as one or more software modules in order to perform the operations of the above-described exemplary embodiments, or vice versa.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An apparatus comprising:
    a group generator configured to generate group data by grouping input data into groups;
    a group extracting circuit configured to extract a group bit position of a target group value from the group data;
    a group selector configured to select a group, among the groups, based on the group bit position and select partial data corresponding to the group, which has been selected, from the input data;
    a data extracting circuit configured to sequentially extract a bit position of a target value from the partial data; and
    a processor configured to output an extracted bit position,
    wherein the group generator is configured to generate the groups of the input data so that each of the groups contains a certain number of bits, to determine whether any of the bits contains the target value, and generate the group bit position of a target group which contains the target value, and
    the group selector is configured to select only the groups with the group bit position, respectively, that indicates a presence of the target value in the group.

2. The apparatus of claim 1, wherein the group extracting circuit is further configured to extract a subsequent group bit position of the target group value in response to a determination that all bit positions corresponding to the target value are extracted by the data extracting circuit from the partial data, and
    the group selector is further configured to select subsequent partial data based on the subsequent group bit position.

* * * * *